(12) United States Patent
Lee et al.

(10) Patent No.: US 7,445,997 B2
(45) Date of Patent: Nov. 4, 2008

(54) METHODS OF FORMING NON-VOLATILE MEMORY DEVICES HAVING FLOATING GATE ELECTRODES

(75) Inventors: Won-Jun Lee, Seoul (KR); Tae-Hyun Kim, Gyeonggi-do (KR); Yong-Sun Ko, Gyeonggi-do (KR); Kyung-Hyun Kim, Seoul (KR); Byoung-Moon Yoon, Gyeonggi-do (KR); Ji-Hong Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 176 days.

(21) Appl. No.: 11/103,069

(22) Filed: Apr. 11, 2005

(65) Prior Publication Data
US 2005/0255654 A1 Nov. 17, 2005

(30) Foreign Application Priority Data
May 11, 2004 (KR) .................. 10-2004-0033031

(51) Int. Cl.
*H01L 21/336* (2006.01)
(52) U.S. Cl. ...................... 438/260; 257/E21.209; 257/E21.624
(58) Field of Classification Search ........... 438/260, 438/261; 257/E21.209, E21.621, E21.624, 257/E21.638
See application file for complete search history.

(56) References Cited

U.S. PATENT DOCUMENTS 5,830,771 A * 11/1998 Fukatsu et al. .............. 438/257
5,889,304 A * 3/1999 Watanabe et al. ........... 257/321
8,387,756    4/2002 Muramatsu

FOREIGN PATENT DOCUMENTS

JP         7058221       3/1995
KR    1020020090749 A   12/2001

* cited by examiner

*Primary Examiner*—Chandra Chaudhari
(74) *Attorney, Agent, or Firm*—Myers Bigel Sibley & Sajovec

(57) ABSTRACT

Methods of forming non-volatile memory devices include the steps of forming a semiconductor substrate having first and second floating gate electrodes thereon and an electrically insulating region extending between the first and second floating gate electrodes. A step is then performed to etch back the electrically insulating region to expose upper corners of the first and second floating gate electrodes. Another etching step is then performed. This etching step includes exposing upper surfaces and the exposed upper corners of the first and second floating gate electrodes to an etchant that rounds the exposed upper corners of the first and second floating gate electrodes. The step of etching back the electrically insulating region includes etching back the electrically insulating region to expose sidewalls of the first and second floating gate electrodes having heights ranging from about 30 Å to about 200 Å. The step of exposing the upper corners of the first and second floating gate electrodes to an etchant is followed by the step of etching back the electrically insulating region to expose entire sidewalls of the first and second floating gate electrodes.

34 Claims, 14 Drawing Sheets

METHODS OF FORMING NON-VOLATILE MEMORY DEVICES HAVING FLOATING GATE ELECTRODES

CROSS REFERENCE TO RELATED APPLICATION

This application claims priority under 35 USC § 119 to Korean Patent Application No. 2004-33031, filed on May 11, 2004, the contents of which are hereby incorporated herein by reference.

FIELD OF THE INVENTION

The present invention relates to methods of forming integrated circuit devices and, more particularly, to methods of forming non-volatile memory devices.

BACKGROUND OF THE INVENTION

Generally, a semiconductor memory device may be classified into a volatile memory device such as a dynamic random access memory (DRAM) and a static random access memory (SRAM) that loses data with the passage of time, or a non-volatile memory device such as a flash memory that continuously possesses data regardless of the passage of time. Since the data inputted into the non-volatile memory device is maintained regardless of the passage of time, the flash memory into which the data is electrically inputted and from which the data is electrically outputted has been widely used in current semiconductor memory devices.

The flash memory includes a memory cell in which the data is stored. The memory cell has a stack type gate structure that includes a tunnel oxide layer on a silicon substrate, a floating gate on the tunnel oxide layer, a dielectric layer on the floating gate, and a control gate on the dielectric layer. Inputting the data into the flash memory is carried out by selectively applying a voltage to the control gate and the substrate to charge electrons in the floating gate. Also, outputting the data from the flash memory is carried out by selectively applying a voltage to the control gate and the substrate to discharge electrons from the floating gate. Here, the dielectric layer functions in maintaining the electrons charged in the floating gate and also transmitting the voltage applied to the control gate to the floating gate.

FIG. 1 is a cross sectional view illustrating a conventional flash memory in a word line direction. Referring to FIG. 1, a tunnel oxide layer 12 and a floating gate 14 are stacked on a substrate 10 having an isolation layer pattern 11. A dielectric layer 16 is formed on the floating gate 14. A control gate 18 is formed on the dielectric layer 16. To induce more of a voltage applied from the control gate 18 to the floating gate 14, maintaining a high coupling ratio between the floating gate 14 and the control gate 18 is required. To achieve the above, the dielectric layer 16 has a thinner thickness so that the dielectric layer 16 has an increased capacitance. Also, the dielectric layer 16 has a charge retention characteristic for preventing the leakage of electrons charged in the floating gate 14. Forming a thin thermal oxide layer on the floating gate 14 including doped polysilicon is very difficult and also causes an increase of a leakage current so that an oxide/nitride/oxide (ONO) layer having a dielectric constant higher than that of an oxide layer is used as the dielectric layer 16.

However, since the floating gate 14 has sharp edge portions A, as shown in FIG. 2, portions of the dielectric layer 16 on the edge portions A of the floating gate 14 have a thickness relatively thinner than that of other portions of the dielectric layer 16. This may cause an inferior distribution of the coupling ratio due to a capacitance distribution of a memory device. Further, since an electric field is concentrated on the sharp edge portions of the floating gate 14, the leakage current is increased so that endurance and data retention of the memory cell may be deteriorated.

The above problems may be generated in forming the dielectric layer 16 having the thin thickness by a chemical vapor deposition (CVD) process in replace of the thermal oxidation process. To overcome the above problems, methods of forming floating gates having rounded edge portions exposed from a substrate are disclosed in Korean Patent No. 0396473 and U.S. Pat. No. 6,387,756. However, according to these methods, the edge portions of the floating gate may not have a completely rounded structure. Also, as shown in FIG. 2, the floating gate is partially removed by a width R in an etching process for forming the rounded structure so that the coupling ratio of the non-volatile memory device may be decreased.

SUMMARY OF THE INVENTION

Methods of forming non-volatile memory devices according to embodiments of the invention include the steps of forming a semiconductor substrate having first and second floating gate electrodes thereon and an electrically insulating region extending between the first and second floating gate electrodes. A step is then performed to etch back the electrically insulating region to expose upper corners of the first and second floating gate electrodes. Another etching step is then performed. This etching step includes exposing upper surfaces and the exposed upper corners of the first and second floating gate electrodes to an etchant that rounds the exposed upper corners of the first and second floating gate electrodes. The step of etching back the electrically insulating region includes etching back the electrically insulating region to expose sidewalls of the first and second floating gate electrodes having heights ranging from about 30 Å to about 200 Å. The step of exposing the upper corners of the first and second floating gate electrodes to an etchant is followed by the step of etching back the electrically insulating region to expose entire sidewalls of the first and second floating gate electrodes.

According to aspects of these embodiments, the step of forming a semiconductor substrate may include forming a tunnel oxide layer on an upper surface of the semiconductor substrate and forming an electrically conductive layer on the tunnel oxide layer. The electrically conductive layer, the tunnel oxide layer and the semiconductor substrate are patterned in sequence to define a plurality of floating gate electrodes on the upper surface and a plurality of trenches that extend in the semiconductor substrate and between the plurality of floating gate electrodes. The plurality of trenches and the spaces between the floating gate electrodes are then filled with an electrically insulating layer. The electrically insulating layer is planarized to expose upper surfaces of first and second ones of the plurality of floating gate electrodes and define an electrically insulating region extending between the first and second floating gate electrodes.

In a method of forming a floating gate in accordance with another embodiment of the present invention, an insulation layer pattern is formed in a region between preliminary floating gates and a trench of a substrate. Upper faces of the preliminary floating gates are exposed through the insulation layer pattern. The exposed upper faces of the preliminary floating gates are partially etched to form a floating gate having rounded edge portions.

In a method of forming a floating gate in accordance with still another embodiment of the present invention, an isolation layer is formed in a substrate to divide the substrate into an active region and a field region. Preliminary floating gates are formed in the active region. An insulation layer pattern is formed on the isolation layer at a region between the preliminary floating gates. Upper faces of the preliminary floating gates are exposed through the insulation layer pattern. The exposed upper faces of the preliminary floating gates are partially etched to form a floating gate having rounded edge portions.

In a method of forming a non-volatile memory device in accordance with still other embodiments of the present invention, an insulation layer pattern is formed in a region between preliminary floating gates and a trench of a substrate. Upper faces of the preliminary floating gates are exposed through the insulation layer pattern. The exposed upper faces of the preliminary floating gates are partially etched to form a floating gate having rounded edge portions. The insulation layer pattern is partially etched to form an isolation layer in the trench. A dielectric layer and a control gate are sequentially formed on the substrate having the floating gate and the isolation layer.

According to the present invention, since the exposed upper faces of the preliminary floating gates are etched, the floating gate may have the rounded edge portions without damage to the preliminary floating gates. Thus, the dielectric layer having a uniform thickness may be formed on the floating gate so that a local coupling ratio of the floating gate is not decreased.

BRIEF DESCRIPTION OF THE DRAWINGS

The above and other features and advantages of the invention will become readily apparent by reference to the following detailed description when considered in conjunction with the accompanying drawings wherein.

DESCRIPTION OF THE EMBODIMENTS

Figure 1:
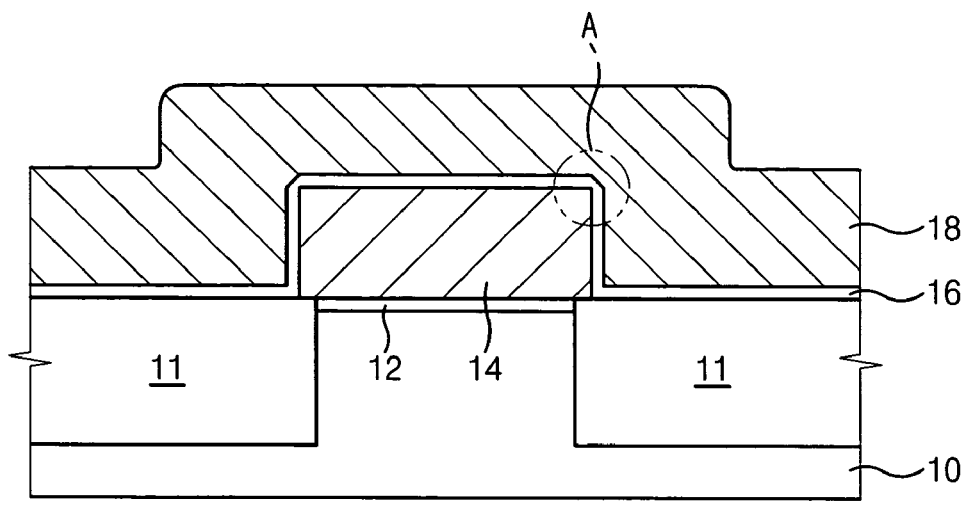
FIG. 1 is a cross sectional view illustrating a conventional flash memory in a word line direction.
Figure 2:
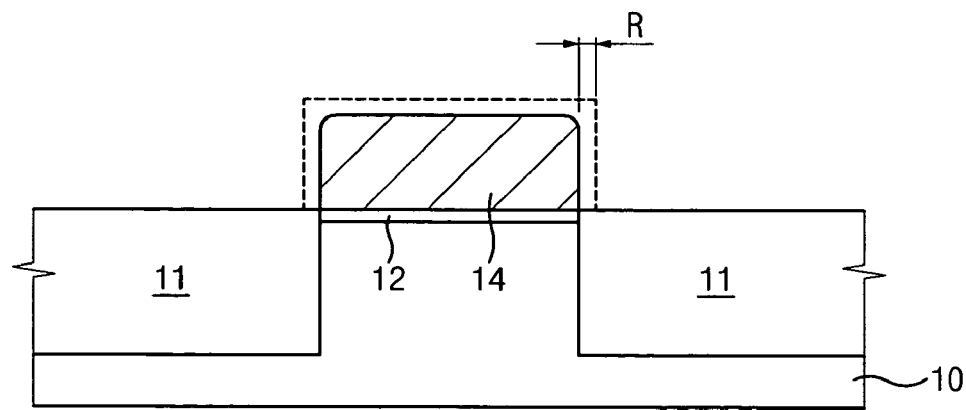
FIG. 2 is a cross sectional view illustrating a conventional floating gate damaged when forming rounded edge portions.

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and completely, and will fully convey the scope of the invention to those skilled in the art. In the drawings, the thickness of layers and regions are exaggerated for clarity. Like reference numerals refer to similar or identical elements throughout. It will be understood that when an element such as a layer, a region or a substrate is referred to as being "on" or "onto" another element, it can be directly on the other element or intervening elements may also be present.

Figure 3:
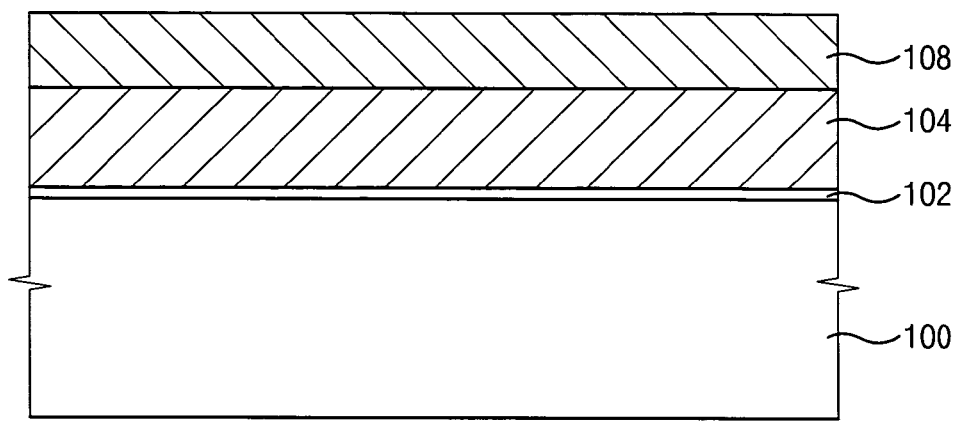
FIGS. 3 to 9 are cross sectional views illustrating a floating gate having rounded edge portions in accordance with a first embodiment of the present invention.

FIGS. 3 to 9 are cross sectional views illustrating a floating gate having rounded edge portions in accordance with a first embodiment of the present invention. Referring to FIG. 3, an oxide layer 102 is formed on a substrate 100. A conductive layer 104 is formed on the oxide layer 102. A hard mask layer 108 is formed on the conductive layer 104. In particular, the oxide layer 102 having a thickness of about 60 Å is formed on the substrate 100 including silicon. The conductive layer 104 used for a floating gate having a thickness of about 800 Å is formed on the oxide layer 102 by a low-pressure chemical vapor deposition (LPCVD) process. Impurities may be implanted into the conductive layer 104 using a $POCl_3$ diffusion process, an ion implantation process or an in-situ doping process. Examples of the conductive layer 104 include a polysilicon layer and an amorphous silicon layer. Silicon nitride is deposited on the conductive layer 104 by an LPCVD process to form the hard mask layer 108 having a thickness of about 300 Å.

Figure 4:
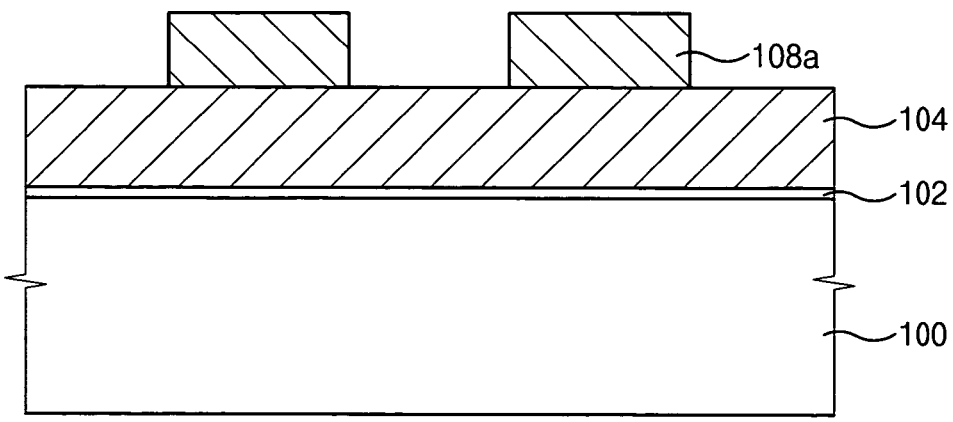

Referring to FIG. 4, the hard mask layer 108 is patterned to form a hard mask pattern 108a for defining a region in which the floating gate is formed. Particularly, photoresist is coated on the hard mask layer 108 by a spin coating method to form a photoresist film (not shown). The photoresist film is exposed and developed using a photo mask to form a photoresist pattern (not shown) for defining the region in which the floating gate is formed. The hard mask layer 108 is dry-etched using the photoresist pattern as an etching mask to form the hard mask pattern 108a. The photoresist pattern is then removed by an ashing process and/or a stripping process.

Figure 5:
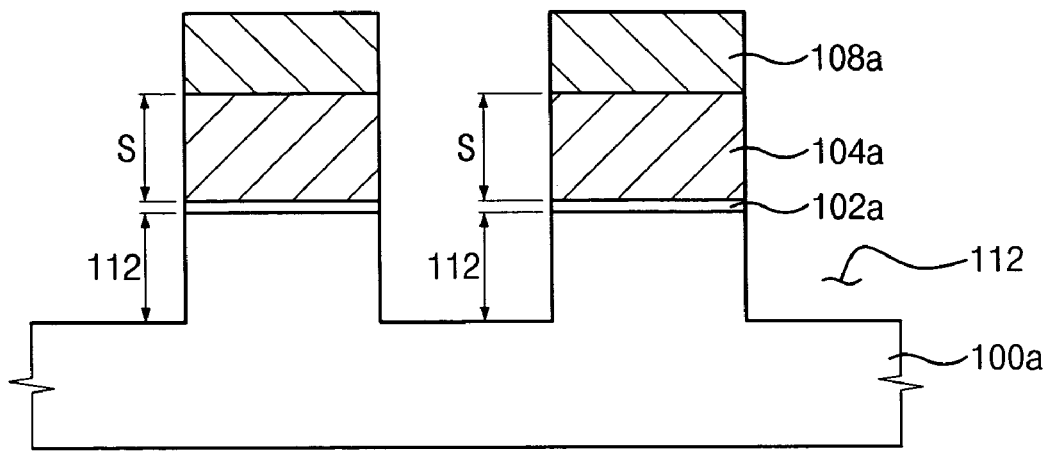

Referring to FIG. 5, a substrate 100a that includes a trench 112 between preliminary floating gates 104a and a gate oxide layer 102a is prepared. In particular, the substrate 100 having the oxide layer 102, the conductive layer 104 and the hard mask pattern 108a is loaded into an etching chamber. An etching gas is introduced into the etching chamber. The conductive layer 104 and the oxide layer 102 are sequentially etched using the hard mask pattern 108a as an etching mask to form the preliminary floating gates 104a and the gate oxide layer 102a. The substrate 100 is partially etched in the etching chamber to form a trench 112 having a depth of about 1,200 Å to about 2,500 Å, preferably about 1,700 Å at a surface portion of the substrate 100. As a result, the conductive layer 104 is separated from one to another by forming the trench 112 to form the preliminary floating gates 104a. That is, the formation of the trench 112 simultaneously defines an active region and the preliminary floating gates 104a so that the preliminary floating gates 104a are self-aligned in the active region. Here, a space S is formed between the preliminary floating gates 104a.

Figure 6:
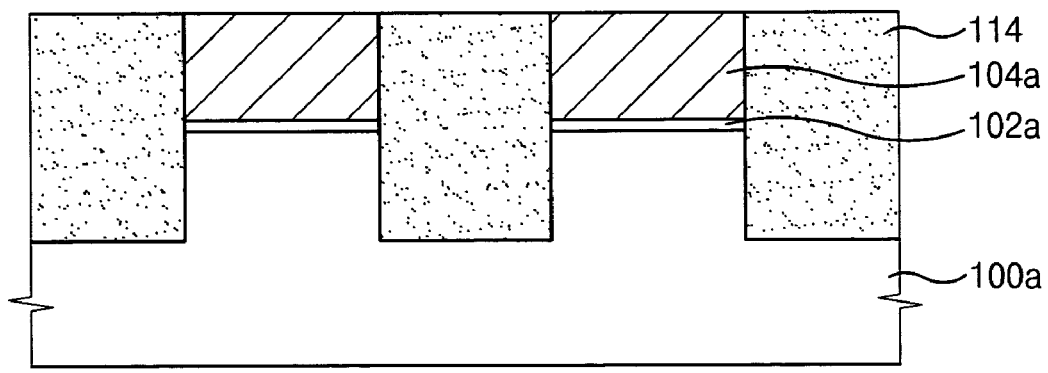

Referring to FIG. 6, an insulation layer 114 is formed on the preliminary floating gates 104a and in the trench 112. The insulation layer 114 is partially removed by a chemical mechanical polishing (CMP) process until the preliminary floating gates 104a are exposed to fill the trench 112 with the insulation layer 114. Particularly, the insulation layer 114 may be formed before or after the hard mask pattern 108a is removed. According to the present embodiment, after the hard mask pattern 108a is removed, the insulation layer 114 is then formed. To prevent the substrate 100a from being damaged and a leakage current from generating due to impact of ions having a high energy in forming the trench 112, the substrate 100a is thermally treated under an oxidation atmosphere to form a thermal oxide layer (not shown) on a bottom face and a side face of the trench 112. The thermal oxide layer may have a thickness of about 30 Å. The hard mask pattern 108a is removed by a dry etching process. When the hard mask pattern 108a has an etching selectivity lower than that of the silicon substrate 100a in the dry etching process, the trench 112 may have a sharp bottom profile and an undesired depth. Thus, the etching selectivity ratio between the hard mask pattern 108a and the silicon substrate 100a may be no less than about 10:1, preferably no less than about 20:1. Oxide having a good gap-filling characteristic is deposited by a CVD process to fill the space S between the trench 112 and the preliminary floating gates 104a with the insulation layer 114. Here, oxide may include high-density plasma (HDP) oxide. The insulation layer 114 is removed until upper faces of the preliminary floating gates 104a are exposed to fill the trench 112 and the space S with the insulation layer 114.

Figure 7:
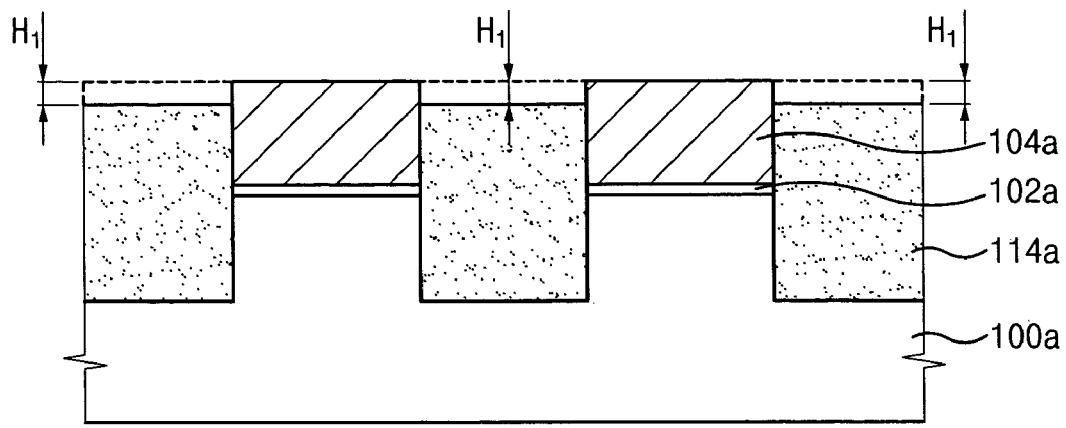

Referring to FIG. 7, the insulation layer 114 is primarily etched to form an insulation layer pattern 114a having an upper face lower than that of the preliminary floating gates 104a. Here, the primary etching process may include a wet etching process. The upper faces of the preliminary floating gates 104a are higher than that of the insulation layer pattern 114a by a height H1 of about 30 Å to about 200 Å. Thus, the etched depth of the insulation layer 114 may be about 30 Å to about 200 Å. Here, when the etched thickness of the insulation layer 114 is below about 30 Å, small edge portions of the preliminary floating gates 104a may be exposed. As a result, the exposed small edge portions of the preliminary floating gates 104a may not be etched by the wet etching process so that a rounded structure may not be formed at the exposed small edge portions of the preliminary floating gates 104a. On the contrary, when the etched thickness of the insulation layer 114 is above about 200 Å, a rounded structure may be formed at exposed edge portions of the preliminary floating gates 104a. However, since the exposed edge portions of the preliminary floating gates 104a are very large, the preliminary floating gates 104a may be greatly damaged so that the coupling ratio of the memory device may be decreased. Accordingly, the etched depth of the insulation layer 114 may be preferably about 30 Å to about 200 Å, more preferably about 100 Å.

Figure 8:
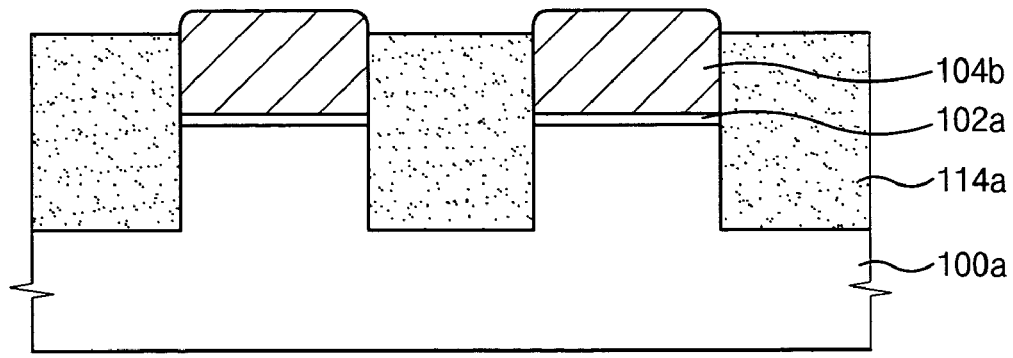

Referring to FIG. 8, the upper portions of the preliminary floating gates 104a, which are exposed through the insulation layer pattern 114a, are etched to form a floating gate 104b having rounded edge portions. The rounded edge portions may be formed by a wet etching process using an etching solution or by etching a thermally oxidized portion of the preliminary floating gates 104a. In the present embodiment, the rounded edge portions are formed by the wet etching process using the etching solution. The wet etching process may include converting polysilicon in the preliminary floating gates 104a into an oxidized polysilicon by reacting polysilicon with an oxidizer in the etching solution, and removing the oxidized polysilicon from the preliminary floating gates 104a. Here, since the edge portions of the preliminary floating gates 104a are three-dimensionally etched, the edge portions of the preliminary floating gates 104a are etched more than an upper face or a side face of the preliminary floating gates 104. As a result, the edge portions of the floating gates 104b have completely rounded structures.

Furthermore, when the etched thickness of the preliminary floating gates 104a is below about 30 Å, the completely rounded structures may not be formed at the edge portions of the preliminary floating gates 104a. On the contrary, when the etched thickness of the preliminary floating gates 104a is above about 200 Å, the edge portions of the preliminary floating gates 104a may be etched too much so that the coupling ratio of the memory device may be decreased. Accordingly, the etched thickness of the preliminary floating gates 104a is preferably thinner than that of the insulation layer 114.

Figure 9:
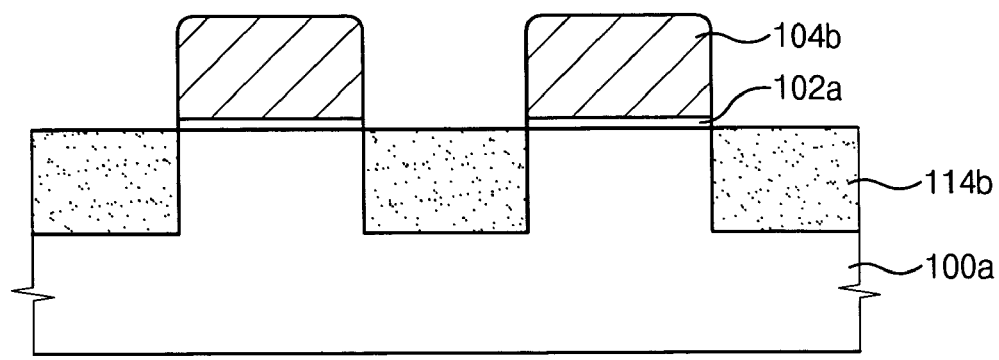

Referring to FIG. 9, the insulation layer pattern 114a between the floating gates 104b having the rounded edge portions is secondarily etched to form an isolation layer 114b in the trench 112. According to the present embodiment, the floating gates 104b have the completely rounded edge portions without damaged preliminary floating gates 104a so that an electric field may not be concentrated on the edge portions of the floating gates 104b.

Figure 10:
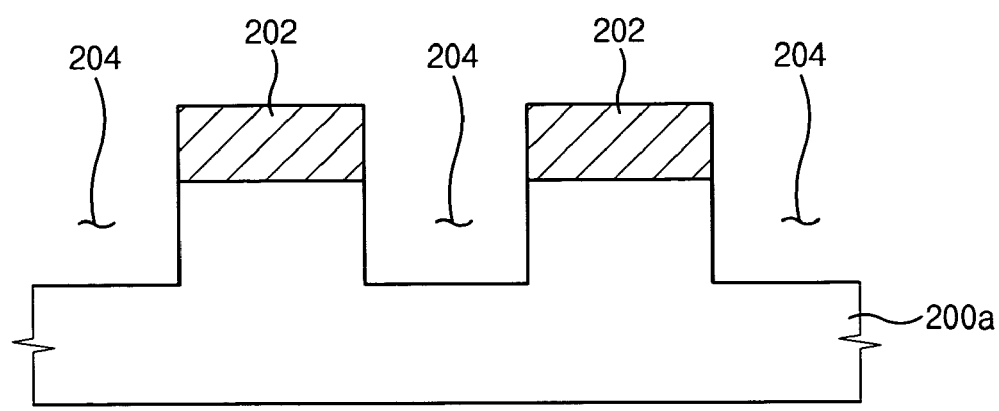
FIGS. 10 to 16 are cross sectional views illustrating a floating gate having rounded edge portions in accordance with a second embodiment of the present invention.

FIGS. 10 to 16 are cross sectional views illustrating a floating gate having rounded edge portions in accordance with a second embodiment of the present invention. Referring to FIG. 10, a trench 204 is formed at a surface portion of a substrate 200. Particularly, a first hard mask pattern 202 for defining an active region and a field region is formed on the substrate 200. The substrate 200 is dry-etched using the first hard mask pattern 202 as an etching mask to form the trench 204 having a depth of about 1,700 Å. To prevent the damage of the substrate 200 and the generation of a leakage current due to the dry etching process, the substrate 200a having the trench 204 is thermally treated under an oxidation atmosphere.

Figure 11:
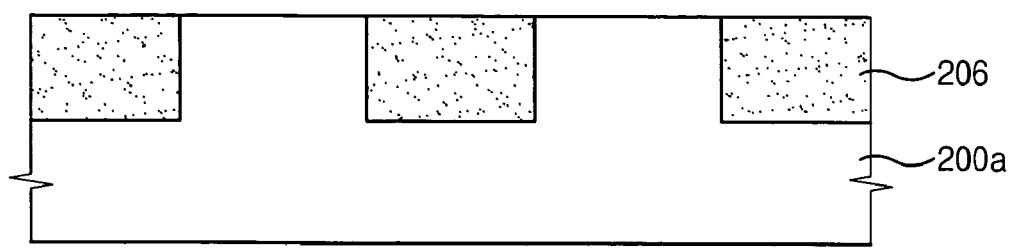

Referring to FIG. 11, the first hard mask pattern 202 is then removed. An oxide layer (not shown) having a good gap-filling characteristic is formed on the substrate 200 and in the trench 204 by a CVD process. The oxide layer is planarized by a CMP process until a surface of the substrate 200a is exposed to form an isolation layer 206 in the trench 204.

Figure 12:
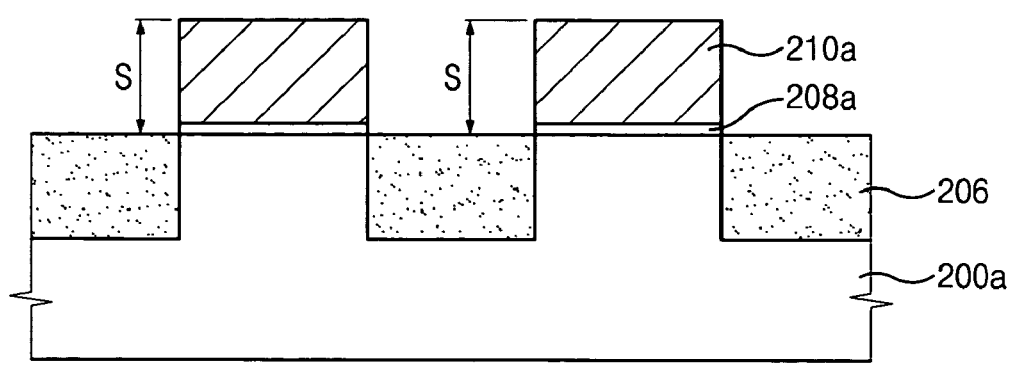

Referring to FIG. 12, a gate oxide layer 208a and preliminary floating gates 210a are sequentially formed on the substrate 200a having the isolation layer 206. Particularly, an oxide layer (not shown) having a thickness of about 60 Å is formed on the substrate 200a by a thermal oxidation process. A conductive layer (not shown) having a thickness of about 800 Å is formed on the oxide layer by a CVD process. The conductive layer may include polysilicon. A second hard mask pattern (not shown) for defining floating gates is formed on the conductive layer. The conductive layer and the oxide layer are etched using the second hard mask pattern as an etching mask to form the gate oxide layer 208a and the preliminary floating gates 210a. A space S exposing the isolation layer 206 exists between the preliminary floating gates 210a. The second hard mask pattern is then removed.

Figure 13:
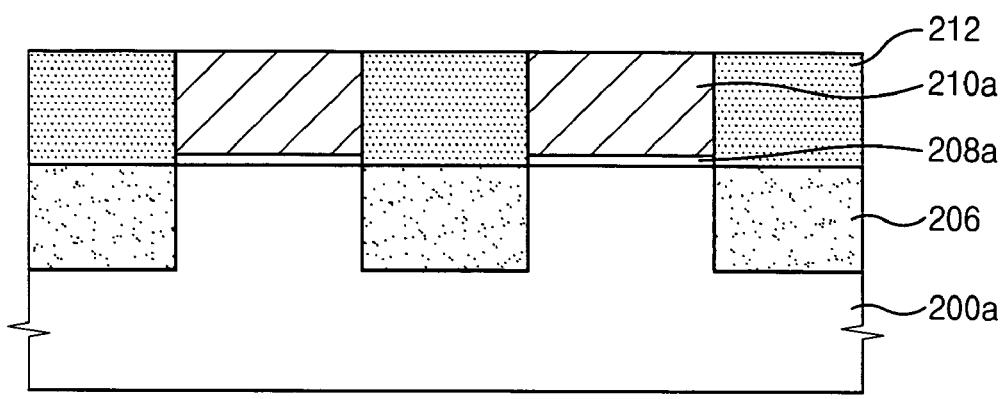
Figure 14:
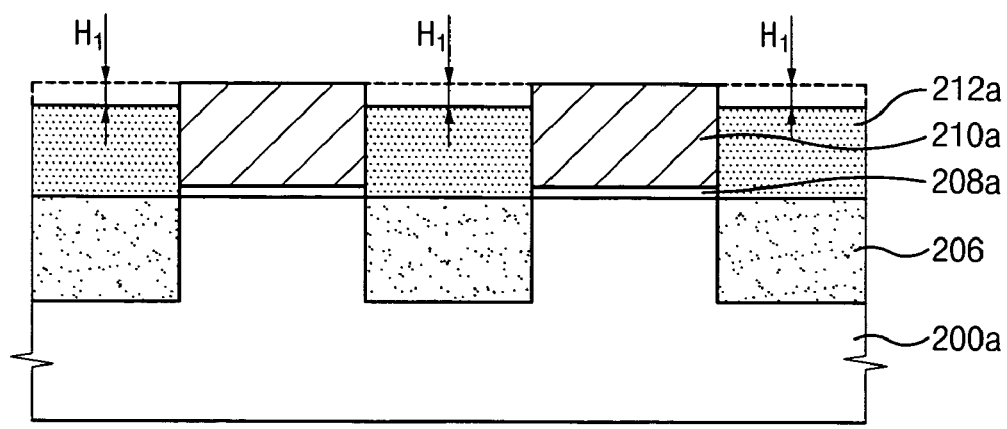

Referring to FIG. 13, an insulation layer 212 is formed in the space S. Surfaces of the preliminary floating gates 210a are exposed through the insulation layer 212. Referring to FIG. 14, the insulation layer 212 is primarily etched to form an insulation layer pattern 212a having an upper face lower than that of the preliminary floating gates 210a. Here, the primary etching process may include a wet etching process. The upper faces of the preliminary floating gates 210a are higher than that of the insulation layer pattern 212a by a height H1 of about 30 Å to about 200 Å. Thus, the etched thickness of the insulation layer 212 may be about 30 Å to about 200 Å. When the etched thickness of the insulation layer 212 is below about 30 Å, small edge portions of the preliminary floating gates 210a may be exposed. As a result, the exposed small edge portions of the preliminary floating gates 210a may not be etched by the wet etching process so that a rounded structure may not be formed at the exposed small edge portions of the preliminary floating gates 210a. On the contrary, when the etched thickness of the insulation layer 212 is above about 200 Å, a rounded structure may be formed at exposed edge portions of the preliminary floating gates 210a. However, since the exposed edge portions of the preliminary floating gates 210a are very large, the preliminary floating gates 210a may be greatly damaged so that the coupling ratio of the memory device may be decreased. Accordingly, the etched thickness of the insulation layer 212 may be preferably about 30 Å to about 200 Å, more preferably about 100 Å.

Figure 15:
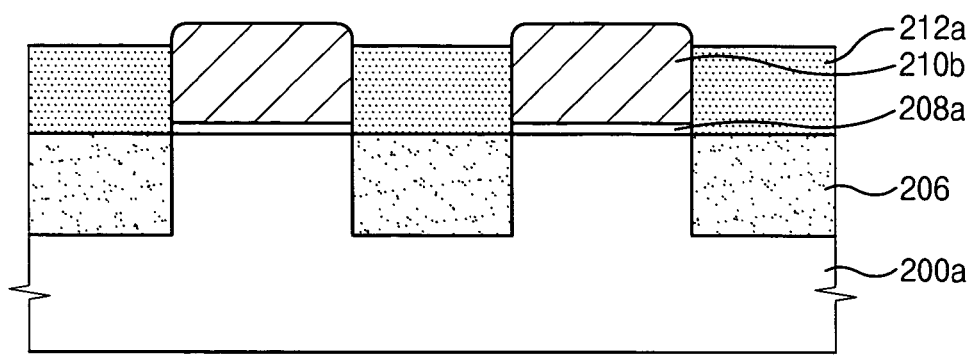

Referring to FIG. 15, the upper portions of the preliminary floating gates 210a exposed through the insulation layer pattern 212a are etched to form a floating gate 210b having rounded edge portions. The rounded edge portions may be formed by a wet etching process using an etching solution or by etching a thermally oxidized portion of the preliminary floating gates 210a. In the present embodiment, the rounded edge portions are formed by removing the thermally oxidized portion of the preliminary floating gates 210a after oxidizing the preliminary floating gates 210a. Here, since the edge portions of the preliminary floating gates 210a are three-dimensionally etched, the edge portions of the preliminary floating gates 210a are etched more than an upper face of the preliminary floating gates 210a. The wet etching process may include converting polysilicon in the preliminary floating gates 210a into an oxidized polysilicon by reacting polysilicon with an oxidizer in the etching solution, and removing polysilicon from the preliminary floating gates 210a. Examples of the oxidizer include an SC1 solution, $O_3$-diluted hydrofluoric (DHF) acid solution or an $H_2O_2$ solution. As a result, the edge portions of the floating gates 210b have completely rounded structures.

Figure 16:
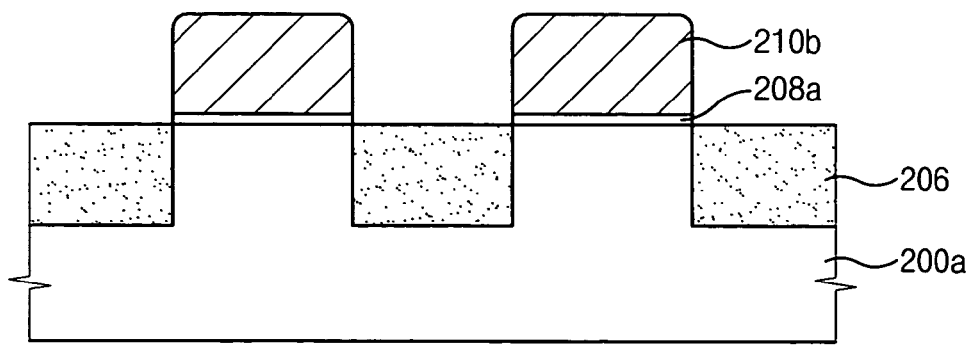

Referring to FIG. 16, the insulation layer pattern 212a between the floating gates 210b having the rounded edge portions is secondarily removed. Here, the floating gates 210b are separated from each other. According to the present embodiment, the floating gates 210b have the completely rounded edge portions without damaged preliminary floating gates 210a so that an electric field may not be concentrated on the edge portions of the floating gates 210b.

Figure 17:
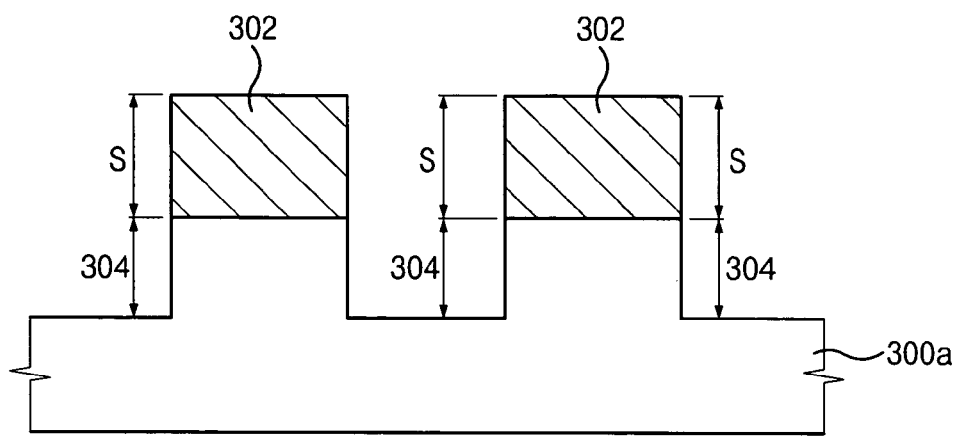
FIGS. 17 to 24 are cross sectional views illustrating a floating gate having rounded edge portions in accordance with a third embodiment of the present invention.
Figure 18:
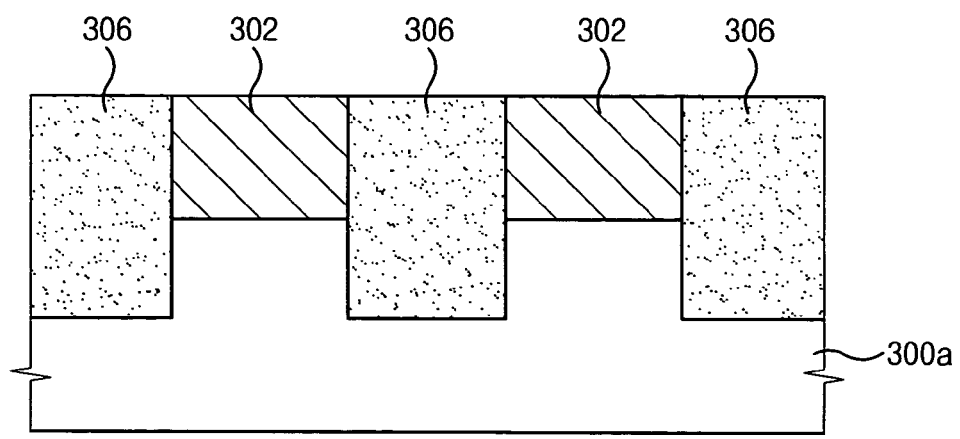

FIGS. 17 to 24 are cross sectional views illustrating a floating gate having rounded edge portions in accordance with a third embodiment of the present invention. Referring to FIGS. 17 and 18, a trench 304 is formed at a surface portion of a substrate 300 exposed through a hard mask pattern 302. In particular, the hard mask pattern 302 for defining an active region and a field region is formed on the substrate 300. Here, the hard mask pattern 302 may have a height substantially identical to that of preliminary floating gates. The substrate 300 is dry-etched using the first hard mask pattern 202 as an etching mask to form the trench 304 having a depth of about 1,700 Å. To prevent the substrate 300 from being damaged and a leakage current from generating due to the dry etching process, the substrate 300a having the trench 304 is thermally treated under an oxidation atmosphere. An insulation layer 306 is formed in a space S between the trench 304 and the hard mask pattern 302. Particularly, an oxide layer having a good gap-filling characteristic is formed on the substrate 300 and in the trench 304 by a CVD process. The oxide layer is planarized by a CMP process until a surface of the hard mask pattern 302 is exposed to form the insulation layer 306 in the trench 304.

Figure 19:
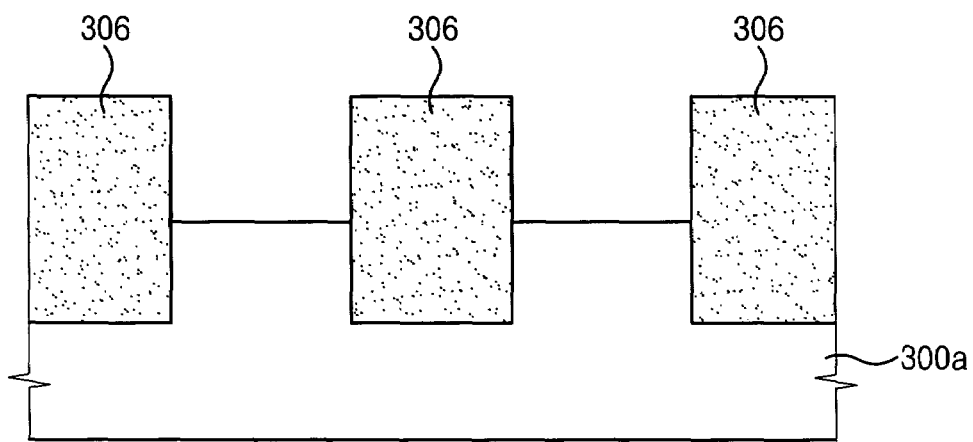
Figure 20:
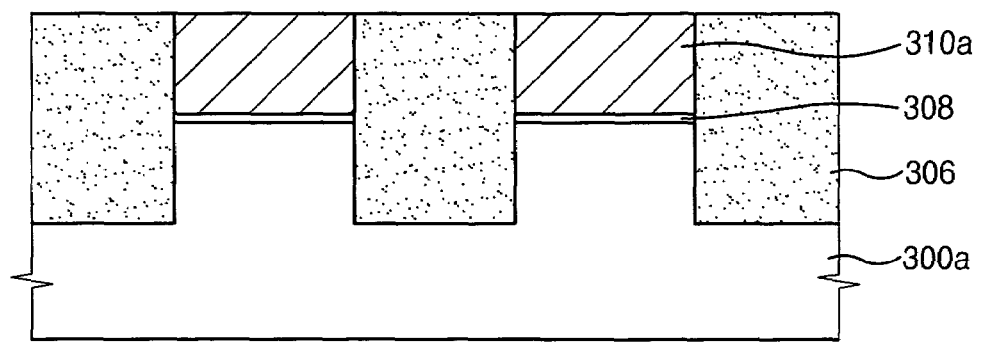

Referring to FIGS. 19 and 20, the hard mask pattern 302 is then removed. A gate oxide layer 308a and preliminary floating gates 310a are sequentially formed in the space S. Particularly, the hard mask pattern 302 is removed by an etching process. The gate oxide layer 308 having a thickness of about 60 Å is formed on a portion of the substrate 300a on which the insulation layer 306 is not formed by a thermal oxidation process. A conductive layer (not shown) is formed on the oxide layer to fill up the space S with the conductive layer. The conductive layer including polysilicon may be formed by a CVD process. The conductive layer is planarized by CMP process until a surface of the insulation layer 306 is exposed to form the preliminary floating gates 310a between the insulation layers 306.

Figure 21:
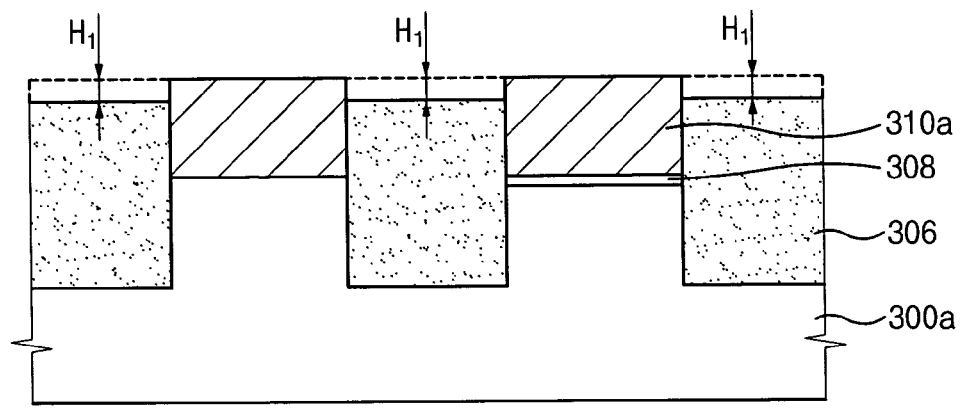

Referring to FIG. 21, the insulation layer 306 is primarily etched to form an insulation layer pattern 306a having an upper face lower than that of the preliminary floating gates 310a. Here, the primary etching process may include a wet etching process. The upper faces of the preliminary floating gates 310a are higher than that of the insulation layer pattern 306a by a height H1 of about 30 Å to about 200 Å. Thus, the etched thickness of the insulation layer 306 may be about 30 Å to about 200 Å. When the etched thickness of the insulation layer 306 is below about 30 Å, small edge portions of the preliminary floating gates 310a may be exposed. As a result, the exposed small edge portions of the preliminary floating gates 310a may not be etched by the wet etching process so that a rounded structure may not be formed at the exposed small edge portions of the preliminary floating gates 310a.

On the contrary, when the etched thickness of the insulation layer 306 is above about 200 Å, a rounded structure may be formed at exposed edge portions of the preliminary floating gates 310a. However, since the exposed edge portions of the preliminary floating gates 310a are very large, the preliminary floating gates 310a may be greatly damaged so that the coupling ratio of the memory device may be decreased. Accordingly, the etched thickness of the insulation layer 306 may be preferably about 30 Å to about 200 Å, more preferably about 100 Å.

Figure 22:
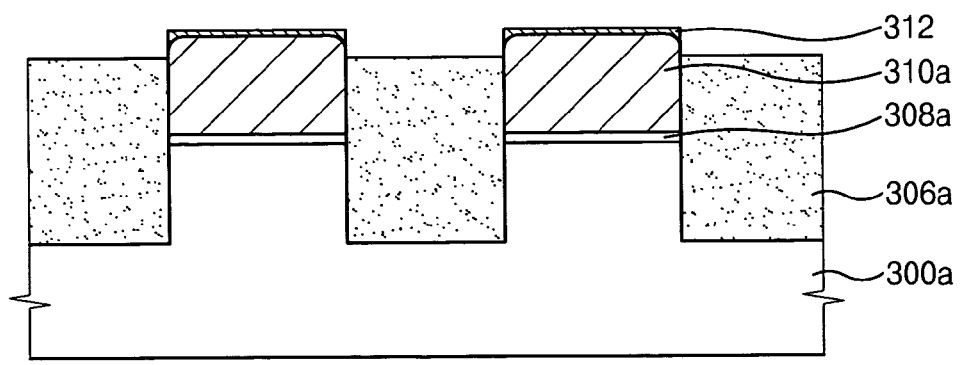
Figure 23:
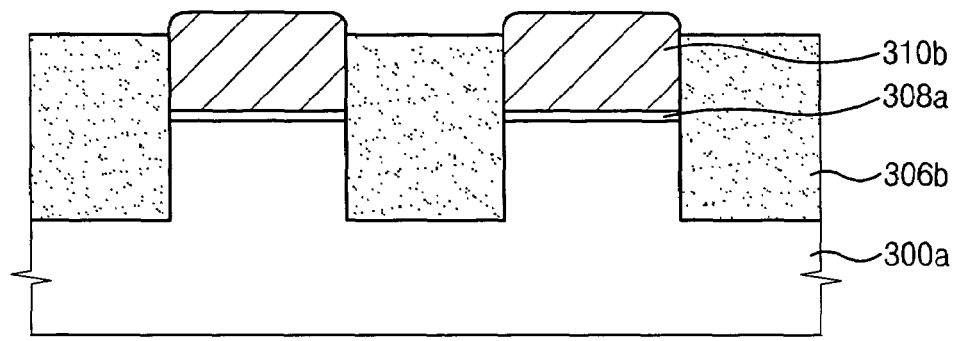

Referring to FIGS. 22 and 23, the upper portions of the preliminary floating gates 310a exposed through the insulation layer pattern 306a are naturally or thermally oxidized to form an oxidized silicon layer 312. Here, since the edge portions of the preliminary floating gates 310a are three-dimensionally oxidized, the edge portions of the preliminary floating gates 310a are oxidized more than an upper face of the preliminary floating gates 310a. The oxidized silicon layer 312 is then removed to form a floating gate 310b having rounded edge portions. Here, the oxidized silicon layer 312 may be removed by an etching solution that is capable of etching oxide.

Figure 24:
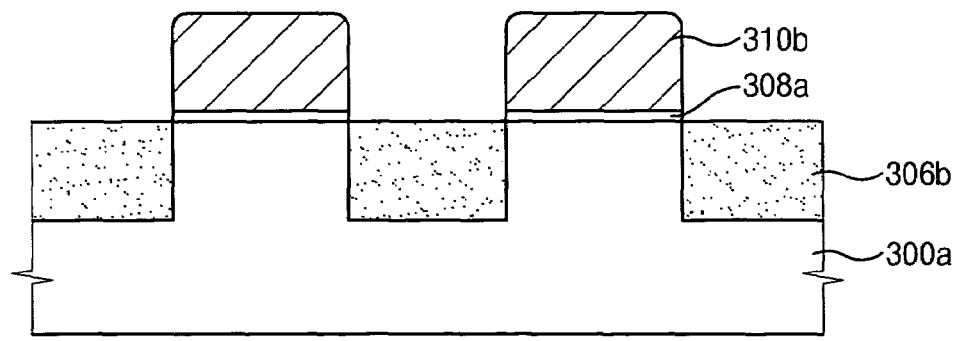

Referring to FIG. 24, the insulation layer pattern 306a between the floating gates 310b having the rounded edge portions is secondarily etched to form an isolation layer 306b in the trench 304. Here, the floating gates 310b are separated from each other. According to the present embodiment, the floating gates 310b have the completely rounded edge portions without damaged preliminary floating gates 310a so that an electric field may not be concentrated on the edge portions of the floating gates 310b.

Figure 25:
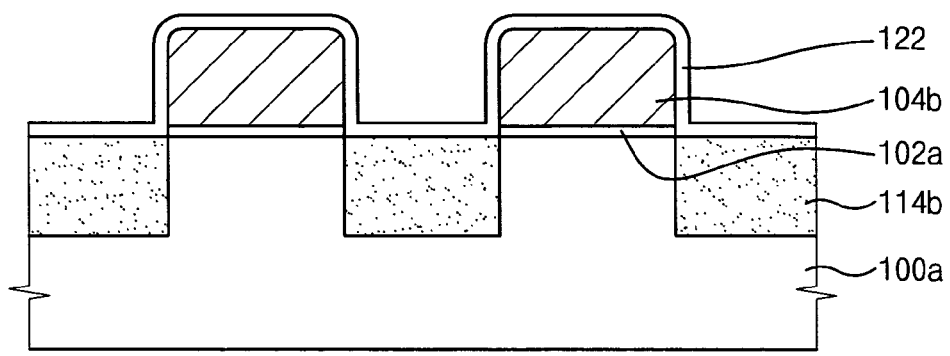
FIGS. 25 to 27 are cross sectional views illustrating a non-volatile memory device that includes the floating gate having the rounded edge portions in accordance with a fourth embodiment of the present invention.
Figure 26:
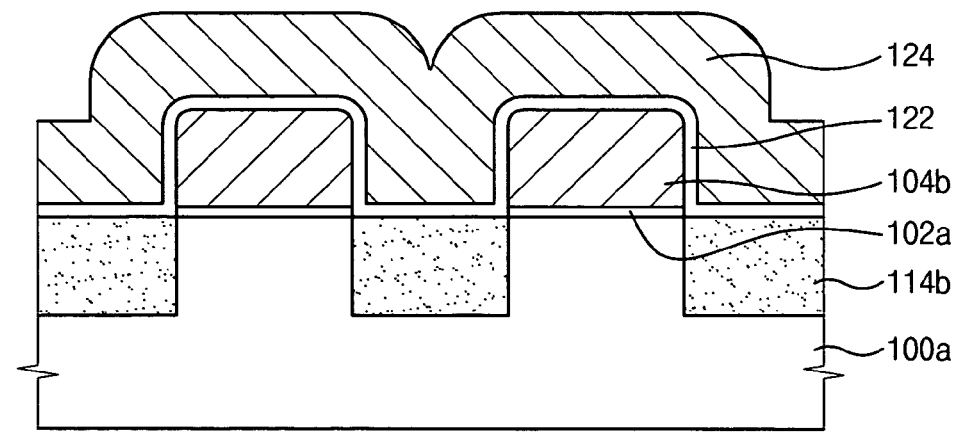
Figure 27:
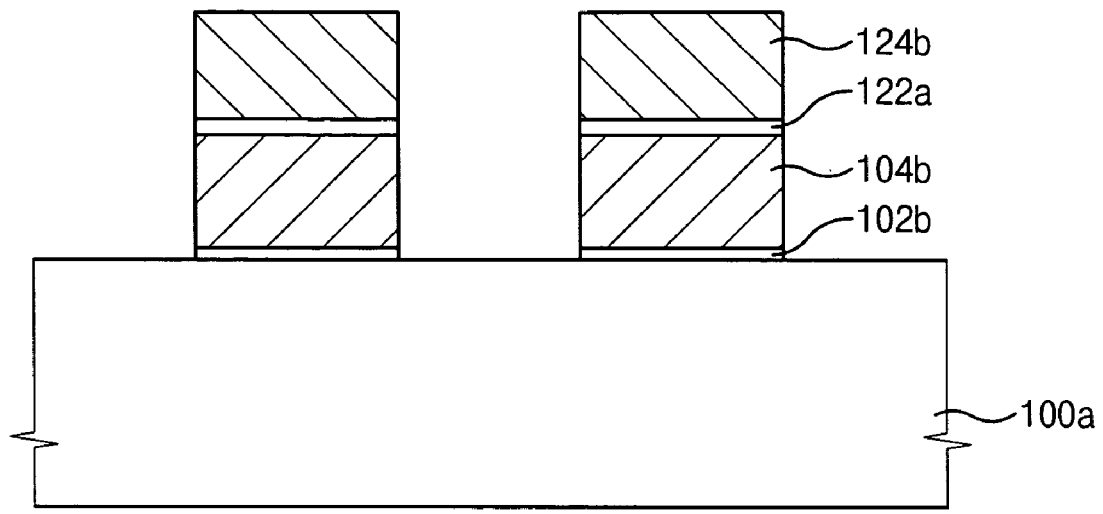

FIGS. 25 to 27 are cross sectional views illustrating a non-volatile memory device that includes the floating gate having the rounded edge portions in accordance with a fourth embodiment of the present invention. Referring to FIG. 25, a dielectric layer 122 having a uniform thickness is formed on the substrate 100a having the floating gate in FIG. 9. The dielectric layer 122 may have an oxide/nitride/oxide (ONO) structure. Also, the dielectric layer 122 may be formed by a thermal oxidation process or an LPCVD process. When the dielectric layer 122 is formed by the LPCVD process, the dielectric layer 122 is annealed under NO or N2O atmosphere for providing characteristics substantially identical to those of a thermal oxide layer to the dielectric layer 122.

Referring to FIG. 26, a control gate layer 124 as a second conductive layer is formed on the dielectric layer 122. Examples of the second conductive layer 124 include a polysilicon layer doped with N⁺ impurities, a polysilicon/metal silicide layer, etc. Here, examples of the metal silicide layer include a tungsten silicide layer, a titanium silicide layer, a cobalt silicide layer, a tantalum silicide layer, etc. Preferably, the polysilicon layer may have a thickness of about 800 Å and the metal silicide layer may have a thickness of about 100 Å to about 400 Å.

Referring to FIG. 27, the control gate layer 124 is patterned to form a control gate 124b. The dielectric layer 122 and the floating gate 104b are dry etched by a unit cell until a surface of the substrate 100a between the isolation layer 114 is exposed to form a stacked non-volatile memory cell 1300.

According to the present invention, the isolation layer is partially etched to expose the upper portions of the preliminary floating gates. The exposed upper portions of the preliminary floating gates are isotropically etched so that the floating gate may have the rounded edge portions without damaged preliminary floating gates. Also, the electric field may be not concentrated on the edge portions of the floating gate. Further, the coupling ratio of the floating gate may be decreased. Particularly, the dielectric layer having a uniform thickness may be formed on the floating gate so that a local coupling ratio of the floating gate may be decreased.

Having described the preferred embodiments of the present invention, it is noted that modifications and variations can be made by persons skilled in the art in light of the above teachings. It is therefore to be understood that changes may be made in the particular embodiment of the present invention disclosed which is within the scope and the spirit of the invention outlined by the appended claims.

What is claimed is:

1. A method of forming a non-volatile memory device, comprising the steps of:
   forming a semiconductor substrate having first and second floating gate electrodes thereon and an electrically insulating region extending between the first and second floating gate electrodes;
   etching back the electrically insulating region to expose upper corners of the first and second floating gate electrodes; and
   exposing upper surfaces and the exposed upper corners of the first and second floating gate electrodes to an etchant that rounds the exposed upper corners of the first and second floating gate electrodes.

2. The method of claim 1, wherein the step of etching back the electrically insulating region comprises etching back the electrically insulating region to expose sidewalls of the first and second floating gate electrodes having heights ranging from about 30Å to about 200 Å.

3. The method of claim 2, wherein the step of forming a semiconductor substrate comprises the steps of:
   forming a tunnel oxide layer on an upper surface of the semiconductor substrate;
   forming an electrically conductive layer on the tunnel oxide layer;
   patterning the electrically conductive layer, the tunnel oxide layer and the semiconductor substrate in sequence to define a plurality of floating gate electrodes on the upper surface and a plurality of trenches that extend in the semiconductor substrate and between the plurality of floating gate electrodes;
   filling the plurality of trenches and spaces between the floating gate electrodes with an electrically insulating layer; and
   planarizing the electrically insulating layer to expose upper surfaces of first and second ones of the plurality of floating gate electrodes and define an electrically insulating region extending between the first and second floating gate electrodes.

4. The method of claim 1, wherein the exposing step is followed by the step of etching back the electrically insulating region to expose entire sidewalls of the first and second floating gate electrodes.

5. The method of claim 4, wherein the step of etching back the electrically insulating region is followed by the steps of:
   forming a dielectric layer on upper surfaces and sidewalls of the first and second floating gate electrodes; and
   forming at least one control electrode on the dielectric layer.

6. The method of claim 1, wherein the step of forming a semiconductor substrate comprises the steps of:
   forming a tunnel oxide layer on an upper surface of the semiconductor substrate;
   forming an electrically conductive layer on the tunnel oxide layer;
   patterning the electrically conductive layer, the tunnel oxide layer and the semiconductor substrate in sequence to define a plurality of floating gate electrodes on the upper surface and a plurality of trenches that extend in the semiconductor substrate and between the plurality of floating gate electrodes;
   filling the plurality of trenches and spaces between the floating gate electrodes with an electrically insulating layer; and
   planarizing the electrically insulating layer to expose upper surfaces of first and second ones of the plurality of floating gate electrodes and define an electrically insulating region extending between the first and second floating gate electrodes.

7. A method of forming a floating gate of a non-volatile memory device, comprising:
   forming an insulation layer pattern in a region between preliminary floating gates and a trench of a substrate, the insulation layer pattern exposing upper portions of the preliminary floating gates and at least partially covering sidewalls of the preliminary floating gates; and
   partially removing the exposed upper portions of the preliminary floating gates to form the floating gate having rounded edge portions using the insulation layer pattern to block removal of the at least partially covered sidewalls of the preliminary floating gates.

8. A method of forming a floating gate comprising:
   forming an insulation layer pattern in a region between preliminary floating gates and a trench of a substrate, the insulation layer pattern exposing upper portions of the preliminary floating pates; and
   partially removing the exposed upper portions of the preliminary floating gates to form the floating gate having rounded edge portions; and
   wherein forming the insulation layer pattern comprises:
      sequentially forming an oxide layer and a floating gate layer on the substrate;
      forming a hard mask pattern for defining a layout of the preliminary floating gates on the floating gate layer;
      sequentially etching the floating gate layer, the oxide layer and the substrate using the hard mask pattern as an etching mask to form a gate oxide layer, the preliminary floating gates and the trench;
      removing the hard mask pattern;
      forming an insulation layer in the region between the preliminary floating gates and the trench; and primarily etching the insulation layer to form the insulation layer pattern having an upper face higher than that of the substrate.

9. The method of claim 8, wherein primarily etching the insulation layer is performed by a wet etching process, and the insulation layer is etched by a thickness of about 30 Å to about 200 Å.

10. A method of forming a floating gate comprising:
forming an insulation layer pattern in a region between preliminary floating gates and a trench of a substrate, the insulation layer pattern exposing upper portions of the preliminary floating gates; and
partially removing the exposed upper portions of the preliminary floating gates to form the floating gate having rounded edge portions; and
wherein forming the insulation layer pattern comprises:
forming mask patterns for defining a region in which a trench is formed on the substrate;
dry-etching the substrate using the mask patterns as an etching mask to form the trench in the substrate;
forming insulation layers in the region between the preliminary floating gates and the trench;
removing the mask patterns;
forming the preliminary floating gates between the insulation layers; and
primarily etching the insulation layer to form the insulation layer pattern having an upper face higher than that of the substrate.

11. The method of claim 10, wherein primarily removing the insulation layer is performed by a wet etching process in which the insulation layer is etched by a thickness of about 30 Å to about 200 Å.

12. The method of claim 7, wherein the preliminary floating gates are isotropically etched by a thickness less than a height difference between the preliminary floating gates and the insulation layer pattern.

13. The method of claim 12, wherein removing the preliminary floating gates is performed by a wet etching process.

14. The method of claim 13, wherein the wet etching process is carried out using an etching solution that includes an SC1 solution, $O_3$-diluted hydrofluoric (DHF) acid solution or an $H_2O_2$ solution.

15. The method of claim 7, wherein removing the preliminary floating gates comprises:
reacting polysilicon in the preliminary floating gates with an oxidizer to convert polysilicon into oxidized polysilicon; and
removing oxidized polysilicon from the preliminary floating gates.

16. The method of claim 7, wherein removing the preliminary floating gates comprises:
oxidizing exposed surfaces of the preliminary floating gates; and
removing the oxidized surfaces of the preliminary floating gates.

17. The method of claim 7, after removing the preliminary floating gates, further comprising forming an isolation layer pattern in the trench.

18. A method of forming a floating gate comprising:
providing a substrate that is divided into an active region and a field region by an isolation layer;
forming preliminary floating gates in the active region;
forming an insulation layer pattern on the isolation layer, the insulation layer pattern being positioned in a region between the preliminary floating gates and exposing upper portions of the preliminary floating gates by recessing the insulation layer pattern to partially expose sidewalls of the preliminary floating gates; and
partially removing the exposed upper portions of the preliminary floating gates to form the floating gate having rounded edge portions using the insulation layer pattern to block removal of those portions of the sidewalls of the preliminary floating gates covered by the insulation layer pattern.

19. The method of claim 18, further comprising forming a gate oxide layer between the substrate and the floating gate.

20. The method of claim 18, wherein forming the insulation layer pattern comprises:
forming an insulation layer in the region between the preliminary floating gates, the insulation layer exposing upper faces of the preliminary floating gates; and
primarily etching the insulation layer to form the insulation layer pattern having an upper face higher than that of the isolation layer.

21. The method of claim 20, wherein primarily etching the insulation layer is performed by a wet etching process, and the insulation layer is etched by a thickness of about 30 Å to about 200 Å.

22. The method of claim 18, wherein the preliminary floating gates are isotropically etched by a thickness less than a height difference between the preliminary floating gates and the insulation layer pattern.

23. The method of claim 22, wherein removing the preliminary floating gates is performed by a wet etching process.

24. The method of claim 23, wherein the wet etching process is carried out using an etching solution that includes an SC1 solution, $O_3$-diluted hydrofluoric (DHF) acid solution or an $H_2O_2$ solution.

25. The method of claim 18, wherein removing the preliminary floating gates comprises:
reacting polysilicon in the preliminary floating gates with an oxidizer to convert polysilicon into oxidized polysilicon; and
removing oxidized polysilicon from the preliminary floating gates.

26. The method of claim 18, wherein removing the preliminary floating gates comprises:
oxidizing exposed surfaces of the preliminary floating gates; and
removing the oxidized surfaces of the preliminary floating gates.

27. A method of forming a floating gate comprising:
providing a substrate that is divided into an active region and a field region by an isolation layer;
forming preliminary floating gates in the active region;
forming an insulation layer pattern on the isolation layer, the insulation layer pattern being positioned in a region between the preliminary floating gates and exposing upper portions of the preliminary floating gates; and
partially removing the exposed upper portions of the preliminary floating gates to form the floating gate having rounded edge portions; and
wherein after removing the preliminary floating gates, further
comprising secondarily etching the isolation layer to form an
isolation layer pattern in a trench of the substrate.

28. A method of manufacturing a non-volatile memory device comprising:
forming an insulation layer pattern in a region between preliminary floating gates and a trench of a substrate, the insulation layer pattern exposing upper portions of the preliminary floating gates and partially covering sidewalls of the preliminary floating gates;

partially removing the exposed upper portions of the preliminary floating gates to form the floating gate having rounded edge portions using the insulation layer pattern to block removal of those portions of the sidewalls of the preliminary floating gates covered by the insulation layer pattern;

partially etching the insulation layer pattern to form an isolation layer in the trench; and sequentially forming a dielectric layer and a control gate on the substrate having the floating gate and the isolation layer.

29. The method of claim 28, wherein forming the insulation layer pattern comprises:

forming an insulation layer in the region between the preliminary floating gates, the insulation layer exposing upper faces of the preliminary floating gates; and primarily etching the insulation layer to form the insulation layer pattern having an upper face higher than that of the isolation layer.

30. The method of claim 29, wherein primarily etching the insulation layer is performed by a wet etching process, and the insulation layer is etched by a thickness of about 30 Å to about 200 Å.

31. The method of claim 28, wherein the preliminary floating gates are isotropically etched by a thickness less than a height difference between the preliminary floating gates and the insulation layer pattern.

32. The method of claim 31, wherein removing the preliminary floating gates is performed by a wet etching process.

33. The method of claim 32, wherein the wet etching process is carried out using an etching solution that includes an SC1 solution, $O_3$-diluted hydrofluoric (DHF) acid solution or an $H_2O_2$ solution.

34. The method of claim 28, wherein the dielectric layer comprises an oxide/nitride/oxide layer.

* * * * *

UNITED STATES PATENT AND TRADEMARK OFFICE
CERTIFICATE OF CORRECTION

PATENT NO. : 7,445,997 B2  Page 1 of 1
APPLICATION NO. : 11/103069
DATED : November 4, 2008
INVENTOR(S) : Lee et al.

It is certified that error appears in the above-identified patent and that said Letters Patent is hereby corrected as shown below:

On the Title Page:

Item 56, References Cited, U.S. Patent Documents:
Please correct "8,387,756    Muramatsu"
       To read -- 6,387,756    Muramatsu --

In the Claims:

Column 10, Claim 8, Line 52: Please correct "floating pates"
                             To read -- floating gates --

Signed and Sealed this

Thirtieth Day of December, 2008

JON W. DUDAS
*Director of the United States Patent and Trademark Office*